(12) United States Patent  (10) Patent No.: US 7,770,273 B2
Abe et al.  (45) Date of Patent: Aug. 10, 2010

(54) METHOD FOR FABRICATING PIEZOELECTRIC ELEMENT

(75) Inventors: Takashi Abe, Sendai (JP); Li Li, Sendai (JP)

(73) Assignee: Japan Science and Technology Agency, Saitama (JP)

( * ) Notice: Subject to any disclaimer, the term of this patent is extended or adjusted under 35 U.S.C. 154(b) by 79 days.

(21) Appl. No.: 10/588,240

(22) PCT Filed: Jan. 27, 2005

(86) PCT No.: PCT/JP2005/001564

§ 371 (c)(1),
(2), (4) Date: Aug. 1, 2006

(87) PCT Pub. No.: WO2005/074052

PCT Pub. Date: Aug. 11, 2005

(65) Prior Publication Data

US 2007/0130739 A1    Jun. 14, 2007

(30) Foreign Application Priority Data

Feb. 2, 2004  (JP) ............................. 2004-025780

(51) Int. Cl.
*H01L 41/22* (2006.01)
*H04R 17/00* (2006.01)
(52) U.S. Cl. ...................................... 29/25.35
(58) Field of Classification Search ............. 29/25.35; 310/371, 313, 324; 427/100, 282, 335–337, 427/340

See application file for complete search history.

(56) References Cited

U.S. PATENT DOCUMENTS 4,487,828 A * 12/1984 Hladovcak et al. .......... 430/313

(Continued)

FOREIGN PATENT DOCUMENTS

EP    1156584 A1    11/2001

(Continued)

OTHER PUBLICATIONS

Li Li et al., "High Sensitive, Miniaturized Plano-Convex Quartz Crystal Microbalance Fabricated by Reactive Ion Etching and Melting Photoresist", TRANSDUCERS '03, Jun. 8-12, 2003, pp. 508-511, The 12*th* International Conference on Solid State Sensors, Actuators and Microsystems, Boston.

(Continued)

*Primary Examiner*—A. Dexter Tugbang
*Assistant Examiner*—David P Angwin
(74) *Attorney, Agent, or Firm*—The Webb Law Firm

(57) ABSTRACT

A piezoelectric element is manufactured by applying a masking agent to a surface of a piezoelectric material to form a film of the masking agent on the surface of the piezoelectric material. The film of the masking agent is patterned into a masking pattern. Oil repellent is selectively applied to surface portions of the substrate which are not covered with the patterned film. The patterned film is held in contact with a vapor of a solvent for the masking agent, diluted with an inert gas, to fluidize the film to a domed shape on the surface of the piezoelectric material. The diluted vapor is formed by bubbling the solvent with the inert gas. The dome-shaped film is then cured and the piezoelectric material is dry etched together with the cured film to process the piezoelectric material into a three-dimensional convex profile corresponding to the thickness distribution of the domed shape.

6 Claims, 2 Drawing Sheets

U.S. PATENT DOCUMENTS

| | | | | |
|---|---|---|---|---|
| 4,826,564 | A | * | 5/1989 | Desilets et al. ............... 216/49 |
| 5,178,989 | A | * | 1/1993 | Heller et al. ............... 430/323 |
| 5,646,657 | A | * | 7/1997 | Aoki ............... 347/45 |
| 5,722,162 | A | * | 3/1998 | Chou et al. ............... 29/852 |
| 6,367,133 | B2 | * | 4/2002 | Ikada et al. ............... 29/25.35 |
| 6,530,652 | B1 | * | 3/2003 | Kim et al. ............... 347/70 |
| 6,682,657 | B2 | * | 1/2004 | Dutton et al. ............... 216/2 |
| 6,712,984 | B2 | * | 3/2004 | Sasaki ............... 216/22 |
| 7,067,066 | B2 | * | 6/2006 | Sasaki et al. ............... 216/22 |
| 2002/0022292 | A1 | * | 2/2002 | Barber et al. ............... 438/52 |
| 2003/0020188 | A1 | | 1/2003 | Bolle |
| 2004/0016718 | A1 | * | 1/2004 | Hwu et al. ............... 216/24 |

FOREIGN PATENT DOCUMENTS

| | | |
|---|---|---|
| JP | 11355094 | 12/1999 |
| JP | 2000-232095 | 8/2000 |
| JP | 2002-048907 | 2/2002 |
| JP | 2002-368572 | 12/2002 |
| JP | 2003-168941 | 6/2003 |
| JP | 2003168941 * | 6/2003 |
| JP | 2003-234632 | 8/2003 |
| JP | 2004-349365 | 9/2004 |

OTHER PUBLICATIONS

Written Opinion as received in the corresponding PCT Application No. PCT/JP2005/001564.

Li Li et al.; "Microfabricated Spherical Bi-Convex Quartz Crystal Microbalance Array"; Proceedings of Mems 2005, 18th IEEE International Conference on Micro Electro Mechanical Systems, Jan. 30, 2005, pp. 327-330; IEEE, Miami Beach, FL, USA; XP010811725.

Li Li et al., "High Sensitive, Miniaturized Plano-Convex Quartz Crystal Microbalance Fabricated by Reactive Ion Etching and Melting Photoresist"; Proceedings of Transducers '03, 12th International Conference on Solid-State Sensors, Actuators and Microsystems; Jun. 9, 2003; pp. 508-511; vol. 1; IEEE, Piscataway, NJ, USA; XP010646397.

* cited by examiner

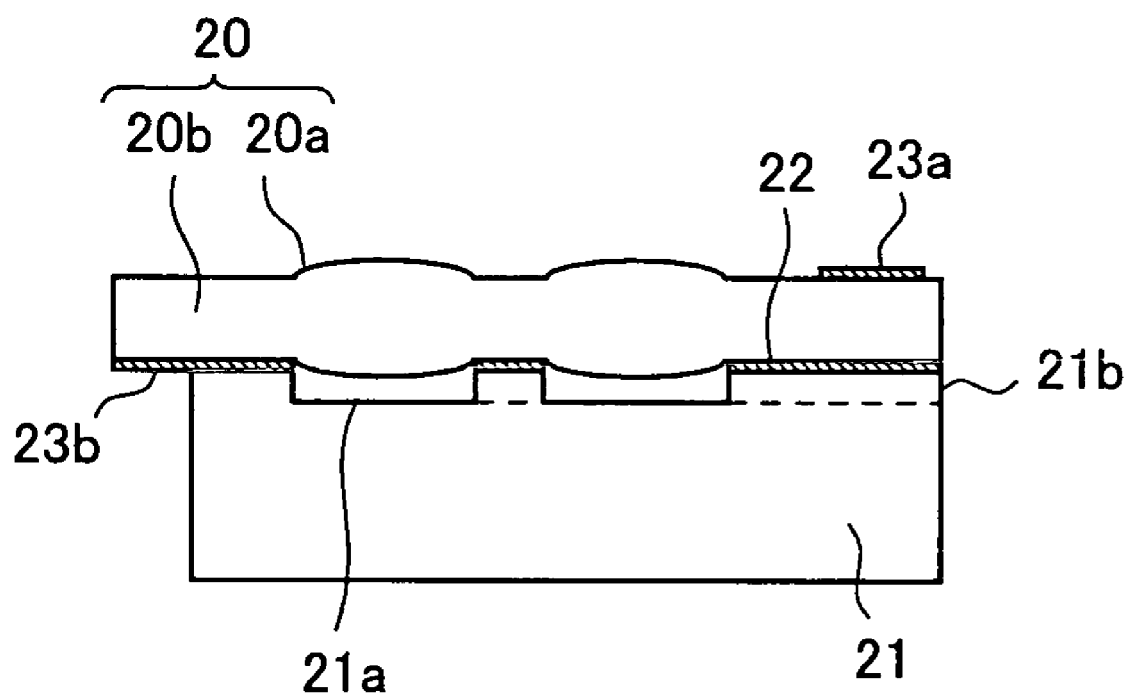

METHOD FOR FABRICATING PIEZOELECTRIC ELEMENT

BACKGROUND OF THE INVENTION

1. Field of the Invention

The present invention relates to a method of manufacturing piezoelectric elements, which have three-dimensional surfaces for distribution of big masses at centers.

2. Description of Related Art

Piezoelectric elements, represented by quartz oscillators, have been used in various fields such as oscillation sources of standard frequency and clocks of electronic or electrical devices. Recent researches and developments are focused on how to reduce thickness of piezoelectric material and how to shape piezoelectric material to lenticular profiles for advanced performance of data processing or transmission capability.

As for large-scaled oscillators with electrodes of several millimeters or more in diameter, piezoelectric material is etched to domed shapes by a wet process and then dressed to profiles with curved surfaces by mechanically polishing edges of the domed shapes. As for small-scaled oscillators with electrodes of 1 mm or less in diameter, piezoelectric material is concaved to profiles suitable for fabrication of high-quality oscillators with less support loss.

A dry process (JP 2002-368572 A), wherein piezoelectric material is machined to an intermediate profile similar to a product shape and then dry etched to the product shape, is also proposed as an advanced concaving method. Other known techniques are a micro-processing method using a micromold or reflow (Li L. et al, Tech. Digest of Transducers (2003), pp. 508-511), and a dry process (JP 2003-234632 A). According to the dry process, a photosensitive agent is applied to a surface of the piezoelectric material at first. The photosensitive agent is then shaped to a photomask with predetermined thickness distribution by controlling an energy of light, which transmits through the photomask. Thereafter, piezoelectric material is dry etched to a product shape together with the thickness-controlled photomask.

Oscillators produced by these known methods are useful as quartz crystal microbalances (QCM) for detecting adsorption of molecules as changes in resonance frequencies. Multichannel-type QCMs are also provided by alignment of such quartz oscillators in array.

A domed profile, which can be shaped by a thermal reflow method, is limited to 100 μm or so in diameter at greatest, since thermal dynamics allows mass transport in a distance of several ten micrometers at most. Piezoelectric material is of course shaped to a bigger domed profile by use of a resist film of several ten micrometers or more in thickness, but such a thicker resist film is more irregular in thickness. Irregularity of the thickness distribution degrades a product profile. The other process, wherein predetermined thickness distribution is imparted to a resist film by controlling an energy of light, is extremely expensive for deposition of a desired mask in comparison with a conventional process, so that its applicability is limited from an economical point of view.

SUMMARY OF THE INVENTION

If a mask with precisely controlled thickness distribution is deposited on a surface of material, the material can be processed to a surface profile corresponding to the thickness distribution, resulting in stability of oscillation characteristics in response to mass loading. The inventors have searched for control of such thickness distribution from this point of view and proposed a new process as JP 2004-349365A. According to the proposed process, a masking agent, which is applied onto a surface of piezoelectric material and then patterned, is dressed to a profile with controlled thickness distribution by melting the masking agent with a heat or by stamping the masking agent with a precise die.

The inventors have further continued researches and examinations on thickness distribution of masking agent, which is applied to a surface of piezoelectric material, and discovered a peculiar behavior of the masking agent. Namely, when the masking agent, applied to the piezoelectric material, is re-dissolved in contact with a solvent vapor, it rises upwards due to a surface tension. The reflow motion of the masking agent is effective for control of thickness distribution.

A major object of the present invention is to easily impart predetermined thickness distribution to a masking film without any dimensional restriction. Another object of the present invention is to provide piezoelectric elements with surface profiles corresponding to thickness distribution of the masks.

According to the present invention, a masking agent is applied onto a surface of piezoelectric material and shaped to a predetermined pattern. The masking agent is then held in contact with a solvent vapor so as to promote reflow of the masking agent on the surface of the piezoelectric material. The reflow motion raises the masking agent upwards on the surface of the piezoelectric material, resulting in formation of a dressed mask with predetermined thickness distribution. Thereafter, the piezoelectric material is dry etched together with the dressed mask. Consequently, the piezoelectric material is processed to a three-dimensional profile corresponding to the thickness distribution of the dressed mask.

The masking agent is applied onto a surface part of piezoelectric material and then shaped to a predetermined pattern for formation of piezoelectric elements. A remaining surface part, where formation of the elements is not intended, is preferably subjected to oil-repelling treatment. The oil-repellent surface part sheds a masking agent, which is fluidized in contact with a solvent vapor, restrains reflow of the masking agent and promotes aggregation of the masking agent at a predetermined region. Such oil-repelling treatment may be performed by formation of a film with less wettability to a solvent or application of an oil repellent, either before or after application of the masking agent.

When a masking agent such as a photoresist is applied onto a surface of piezoelectric material and then fluidized by contact with a stream of a solvent vapor, the masking agent is raised upwards to a convex shape with predetermined thickness distribution. The thickness distribution is advantageous for reforming a surface of the piezoelectric material to a domed shape with a curvature radius within a range of several micrometers to several centimeters, i.e. high applicability to various scales in comparison with a conventional thermal reflow process. A flow rate of the solvent vapor is controlled by supplying a solvent, which is diluted by an inert gas such as nitrogen, and a uniform flow of the solvent vapor is ensured by use of a shower head.

Piezoelectric material, which has a surface partially subjected to oil-repelling treatment, restricts reflow of a masking agent to the other surface part or parts. Restriction of the reflow motion enables formation of one or more domed masks with predetermined thickness distribution on predetermined surface parts of the piezoelectric material. By dry etching the piezoelectric material together with domed masks, the surface parts coated with the domed mask are processed to three-dimensional shapes corresponding to the thickness distribution of the domed masks. In short, the present invention is employable for fabrication of multi-channeled piezoelectric devices, wherein a plurality of piezoelectric elements are arranged with a predetermined pattern, useful as upgraded sensors.

BRIEF DESCRIPTION OF THE DRAWINGS

FIG. 2 is a sectional view illustrating a piezoelectric element fixed to a support.

PREFERRED EMBODIMENTS OF THE INVENTION

Figure 1:
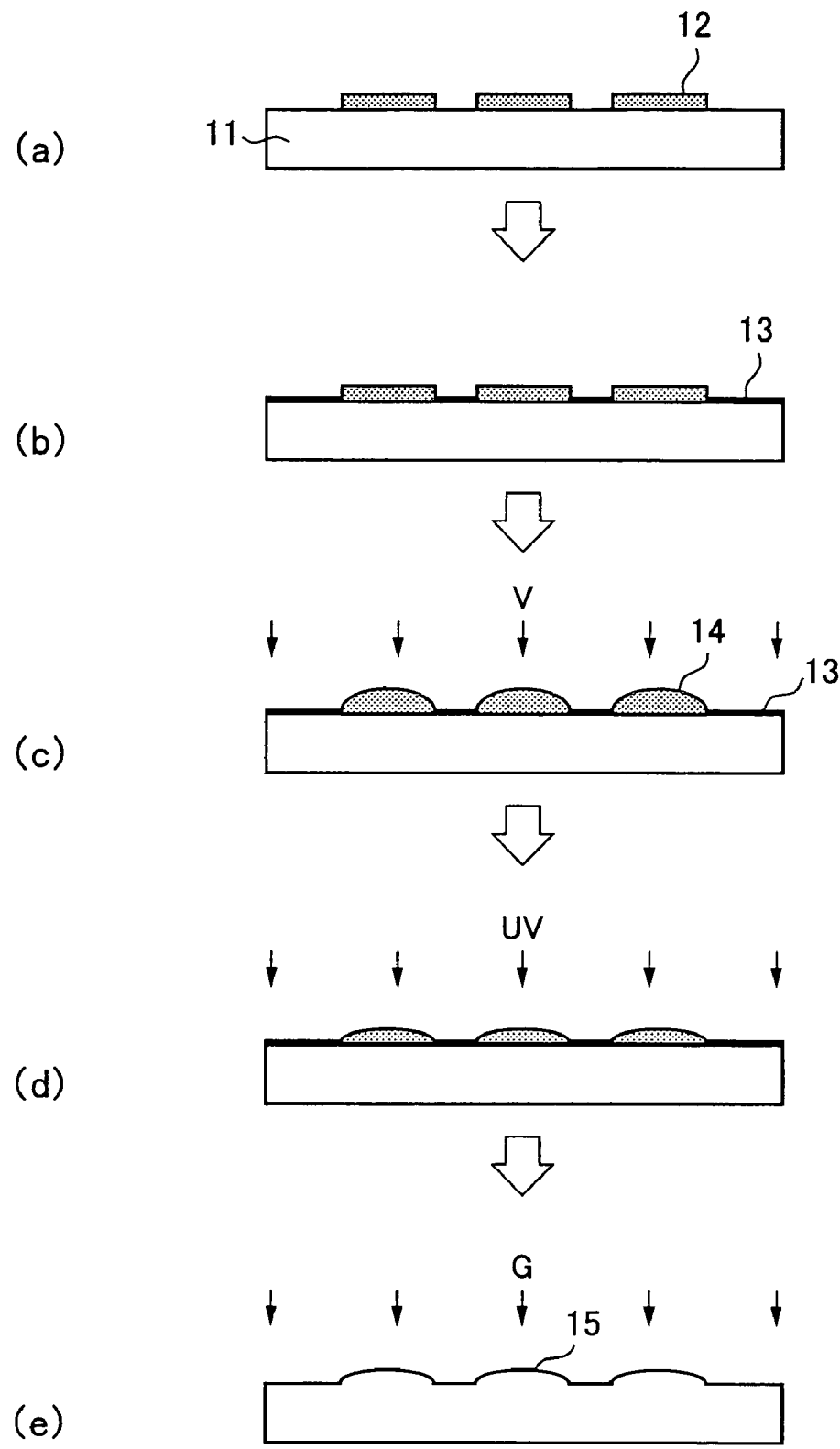
FIG. 1 is a flow chart for explaining a dry etching process for forming piezoelectric material to a three-dimensionally convex profile.

According to the present invention, a piezoelectric element is manufactured by the following steps:

A masking agent such as a photosensitive resin is applied to a substrate 11 of piezoelectric material and patterned to a masking film 12 with predetermined thickness (FIG. 1A). In the case where a plurality of piezoelectric elements are built in one substrate 11, a close-packed pattern of the masking film 12 is preferable for arrangement of piezoelectric elements with high density. The masking agent may be a precursor for formation of an organic polymer, an inorganic polymer or a solgel film, as far as it can be applied with a predetermined pattern by photolithography, laser writing, screen printing or the like.

After formation of the patterned masking film 12, a surface part of the substrate 11 is modified with a proper surface treatment chemical, which repels a solvent for the masking agent, so as to reduce a surface tension of the substrate 11 at the surface part where formation of piezoelectric elements is not intended (FIG. 1B). An oil-repelling film with less wettability to the solvent may be overlaid on the surface part of the substrate 11, instead of application of the surface treatment chemical. The surface treatment chemical is selected from the group consisting of organic and inorganic polymers, each of which has a functional group such as —$CH_3$, —$CF_3$, —$(CH_2)$— or —$(CF_2)$— in its molecule, in relation with a kind of the masking agent. A representative chemical is a fluorocarbon polymer or a silicone polymer.

The substrate 11 is placed in a chamber after the surface modification, and an inert gas mixed with a solvent vapor V is introduced onto the substrate 11 inside the chamber. As a result, the masking agent is re-dissolved in the solvent and fluidized on a surface of the substrate 11. The solvent may be volatile matter, e.g. as xylene, toluene, acetone or alcohol, for efficient dissolution of the masking agent. In the case where a masking agent is a photoresist or the like available on the market, the solvent may be thinner specially designed for the photoresist or the like.

As an increase in volume of a solvent vapor V, which comes in contact with a masking film 12, dissolution of the masking agent in the solvent is more accelerated, and the masking agent is more fluidized due to reduction of viscosity. The solvent vapor V is preferably diluted with an inert gas in order to ensure a sufficient volume of the vapor, and controlled to proper concentration by a feed rate of the inert gas. The solvent vapor V can be introduced as a stream with uniform flow distribution to the surface of the substrate 11 by a shower head, in order to ensure uniform dissolution and fluidization of the masking agent on the surface of the substrate 11. Selective condensation of the solvent on the surface of the substrate 11 may be achieved by holding the substrate 11 at a temperature lower than an evaporating temperature of the solvent during introduction of the solvent vapor V.

The fluidized masking agent aggregates and upheaves as a domed mask 14 at a surface part of the substrate 11 (FIG. 1C). A curvature of the domed mask 14 is varied in relation with thickness of the masking agent, and a radius of the curvature becomes smaller as an increase in thickness of the masking film 12. Influence of gravity is also utilized for shaping the domed mask 14, by setting the substrate 11 at an upward or downward position.

When the masking film 12 is formed to the domed mask 14, fluidization of the masking agent is limited to a surface part of the substrate 11 for formation of piezoelectric elements, since the other surface parts repel the solvent due to the oil-repelling treatment or the oil-repelling film. Of course, the oil-repelling treatment may be omitted, in the case where the substrate 11 is piezoelectric material, which hardly gets wet with the solvent.

After formation of the domed mask 14, the substrate 11 is heated for evaporation of the solvent therefrom and subjected to UV irradiation for curing the domed mask 14 (FIG. 1D). Thereafter, the surface of the substrate 11 is dry etched to a three-dimensional profile 15 corresponding to thickness distribution of the domed mask 14.

Perfluorocarbon (PFC), $SF_6$, chlorine or iodine gas and so forth may be used as a selectively reactive gas G in a dry etching process. The selectively reactive gas G, which is a source of radicals for selective processing or embrittlement of the substrate 11, is introduced as a sole gas or a high-density plasma to a reaction zone. The selectively reactive gas G may be mixed with a non-selectively reactive gas, e.g. Ar, Kr or Xe, for physically etching the substrate, or with a selectivity-controlling gas, e.g. $H_2$ or $O_2$, for etching the domed mask 14 with controlled selectivity.

A relative processing rate can be controlled in response to a mixing ratio of the non-selectively reactive gas or the selectivity-controlling gas with the selectively reactive gas G during dry etching. For instance, the gaseous mixture is changed from a non-selectively reactive gas-enriched composition to a selectively reactive gas-enriched composition during dry etching the domed mask 14. In this case, the surface of the substrate 11 is processed to a profile imitating thickness distribution of the domed mask 14 before change of the gaseous composition, while the substrate 11 is preferentially etched after change of the gaseous composition. Consequently, the surface of the substrate 11 is processed to a three-dimensional shape 15, which amplifies thickness distribution of the domed mask 14.

After the surface of the substrate 11 is processed to a predetermined profile 15, surface parts, which are damaged by dry etching, are removed by hydrofluoric acid or the like, and then the substrate 11 is washed. Thereafter, an objective piezoelectric element is fabricated by a direct patterning process using a deposited mask or a photoresist film for formation of electrodes.

A fabricated piezoelectric element 20 is secured to a bulky support 21 with an adhesive such as silicone resin for reinforcement, as shown in FIG. 2. The support 21 has dents 21a for receiving a convex surface 20a of the piezoelectric element 20 therein. When adjusting recesses are engraved in the substrate 11 at a position between adjacent dents 21a and at a position directing to the outside, a difference in a pressure or a temperature of the substrate 11 from the outside is reduced. Oscillation characteristic of the piezoelectric element 20 is picked up through a surface electrode 23a and a back electrode 23b.

EXAMPLE

AT cut quartz of 100 μm in thickness was provided as a substrate 11. A solvent vapor V was prepared by heating propylene glycol monomethyl ether acetate (PGMEA), i.e. a solvent specialized for a photoresist AZP4400 (offered by Clariant Co., Ltd.), at 75° C. or higher, and bubbling the solvent with a nitrogen gas.

The photoresist was applied as a masking agent to the substrate 11 by a spinner, so as to deposit a masking film 12 of 6 μm in average thickness on the substrate 11. After the masking film 12 was shaped to a predetermined pattern by photolithography, hexamethyldisilazane (HMDS) was applied as a surface treatment chemical 13 to a surface part of the substrate 11, in order to reduce a surface tension of the substrate 11, which was not coated with the masking film 12.

After the surface of the substrate 11 was dried, the substrate 11 was located on a stage inside a chamber and held at a room temperature or so. The solvent vapor V was introduced onto the surface of the substrate 11 through a fluororesin tube, which was located at a position facing to the substrate 11 on the stage, and held in contact with the masking film 12. The solvent vapor V was selectively condensed on the photoresist of the masking film 12. Consequently, the photoresist was fluidized to a semispheroidal domed mask 14, after a lapse of 10 minutes from initiation of the gas supply.

When the domed mask 14 was formed to a predetermined convex shape, the solvent gas V, which was supplied through the fluororesin tube, was changed to sole nitrogen gas. The nitrogen gas was continuously supplied until the domed mask 14 was dried. Thereafter, the photoresist of the domed mask 14 was cured by heating and UV irradiation. The cured domed mask 14 had the semispherical profile that the thickness of 14 μm at its center was gradually decreased to 0 μm at its periphery.

The substrate 11 was then dry etched by a gaseous mixture of $SF_6$:Xe=1:1 at an atmospheric pressure of 0.2 Pa and a room temperature with a self bias voltage of −300 V. Selectivity was 0.3 under the above conditions. That is, thickness distribution of the three-dimensional shape 15, which was imparted to the substrate 11 by dry etching, was converted to a value of (thickness distribution of the domed mask 14)× (selectivity) with respect to a vertical direction. As a result, the height of the three dimensional shape 15 was approximately 4 μm at the center.

The fabricated quartz oscillator had resonance frequency of 20 MHz with linear frequency response to a viscoelastic load larger by 50% or more than an unprocessed crystal board. No spurious oscillation was detected in the vicinity of principal oscillation even in a high-frequency region of 0.8 MHz or more. The results prove that the fabricated quartz oscillator has excellent oscillation characteristics with high reliability.

INDUSTRIAL APPLICABILITY OF THE INVENTION

According to the present invention as mentioned the above, a patterned masking film 12 is fluidized on a substrate 11 by contact with a solvent vapor and dressed to a convex domed mask 14. Thereafter, the substrate 11 is dry etched to a surface profile imitating thickness distribution of the domed mask 14. The fabricated piezoelectric element has excellent oscillation characteristics suitable for measuring a viscoelastic liquid or a macromolecule such as oil or gel due to big mass at its center, so that it is useful as an upgraded sensor for proteins, DNA short chains, biology, chemical analysis and medical diagnosis chips.

The invention claimed is:

1. A method of manufacturing a piezoelectric element, comprising the steps of:
   applying a masking agent to a surface of a piezoelectric material to form a film of the masking agent on the surface of the piezoelectric material;
   patterning the film of the masking agent into a predetermined masking pattern;
   selectively applying an oil repellent to surface portions of the substrate which are not covered with the patterned film;
   holding the patterned film in contact with a vapor of a solvent for the masking agent, diluted with an inert gas, so as to fluidize the film to a domed shape on the surface of the piezoelectric material, wherein the vapor diluted with the inert gas is formed by bubbling the solvent with the inert gas;
   curing the dome-shaped film; and
   dry etching the piezoelectric material together with the cured film, so as to process the piezoelectric material into a three-dimensional convex profile corresponding to thickness distribution of the domed shape.

2. A method of manufacturing a piezoelectric element, comprising:
   applying a masking agent to a surface of a substrate made of a piezoelectric material to form a film of the masking agent on the surface of the substrate;
   patterning the film of the masking agent into a predetermined masking pattern;
   selectively applying an oil repellent to surface portions of the substrate which are not covered with the patterned film;
   contacting the patterned film with a vapor of a solvent for the masking agent, diluted with an inert gas, to fluidize the patterned film into a dome shape, wherein the vapor diluted with the inert gas is formed by bubbling the solvent with the inert gas;
   curing the dome-shaped film; and
   dry etching the surface of the substrate together with the cured film to process the substrate into a three-dimensional convex structure of a profile corresponding to a thickness distribution of the domed shape.

3. The method of claim 2, wherein the dome-shaped film is cured by UV irradiation.

4. The method of claim 2, wherein the dry etching is conducted by using a perfluorocarbon, $SF_6$, chlorine or iodine gas.

5. The method according to claim 1, wherein the oil repellent comprises hexamethyldisilazane.

6. The method according to claim 2, wherein the oil repellent comprises hexamethyldisilazane.

* * * * *